(12) United States Patent
Shin (10) Patent No.: US 7,435,657 B2
(45) Date of Patent: Oct. 14, 2008

(54) METHOD OF FABRICATING TRANSISTOR INCLUDING BURIED INSULATING LAYER AND TRANSISTOR FABRICATED USING THE SAME

(75) Inventor: Dong-Suk Shin, Yongin-si (KR)

(73) Assignee: Samsung Electronics Co., Ltd (KR)

( * ) Notice: Subject to any disclaimer, the term of this patent is extended or adjusted under 35 U.S.C. 154(b) by 451 days.

(21) Appl. No.: 11/257,369

(22) Filed: Oct. 24, 2005

(65) Prior Publication Data

US 2006/0115941 A1      Jun. 1, 2006

(30) Foreign Application Priority Data

Nov. 26, 2004 (KR) .................. 10-2004-0098261

(51) Int. Cl.
*H01L 21/336* (2006.01)
(52) U.S. Cl. ................... 438/300; 257/E21.43
(58) Field of Classification Search .......... 438/282, 438/300, 429; 257/E21.43, E21.562
See application file for complete search history.

(56) References Cited

U.S. PATENT DOCUMENTS

| 5,869,359 | A | * | 2/1999 | Prabhakar | ............ 438/149 |
| 6,084,271 | A | | 7/2000 | Yu et al. | ............ 257/351 |
| 6,365,445 | B1 | | 4/2002 | Yu | ............ 438/149 |
| 6,429,055 | B2 | * | 8/2002 | Oh | ............ 438/163 |

FOREIGN PATENT DOCUMENTS

| JP | 09-074189 | 3/1997 |
| KR | 1998-049920 | 9/1998 |

* cited by examiner

*Primary Examiner*—Chandra Chaudhari
(74) *Attorney, Agent, or Firm*—Mills & Onello LLP (57) ABSTRACT

In a method of fabricating a transistor including a buried insulating layer and transistor fabricated using the same, the method includes sequentially forming a sacrificial layer and a top semiconductor layer on a single crystalline semiconductor substrate. A gate pattern is formed on the top semiconductor layer. A sacrificial spacer is formed to cover sidewalls of the gate pattern. An elevated semiconductor layer is grown on a portion of the top semiconductor layer adjacent to the sacrificial spacer. The sacrificial spacer is removed. A portion of the top semiconductor layer from which the sacrificial spacer is removed is etched until the sacrificial layer is exposed, thereby forming a recess, which separates the top semiconductor layer into a first top semiconductor layer pattern and a second top semiconductor layer pattern, which remain under the gate pattern and the elevated semiconductor layer, respectively. The sacrificial layer is selectively removed. A buried insulating layer is formed to fill a region from which the sacrificial layer is removed. A buried semiconductor layer is grown in the recess. An extending recess extends from the recess and is formed to expose the semiconductor substrate. The extending recess separates the buried insulating layer into a first buried insulating layer pattern and a second buried insulating layer pattern, which are self-aligned to the first and second top semiconductor layer patterns, respectively.

29 Claims, 6 Drawing Sheets

METHOD OF FABRICATING TRANSISTOR INCLUDING BURIED INSULATING LAYER AND TRANSISTOR FABRICATED USING THE SAME

CROSS-REFERENCE TO RELATED APPLICATION

This application claims the benefit of Korean Patent Application No. 2004-98261, filed Nov. 26, 2004, the disclosure of which is hereby incorporated herein by reference in its entirety.

BACKGROUND OF THE INVENTION

1. Field of the Invention

The present invention relates to a method of fabricating a semiconductor device and semiconductor device fabricated using the same and, more particularly, to a method of fabricating a transistor including a buried insulating layer and transistor fabricated using the same.

2. Description of Related Art

Semiconductor devices widely employ a discrete device such as a MOS transistor as a switching device. As the integration density of the semiconductor devices increases, the MOS transistor is gradually being downscaled. Such downscaling leads to a lot of problems, such as a short channel effect (SCE), a drain induced barrier lowering (DIBL) effect, and an increase in junction capacitance. Also, owing to the increased integration of the semiconductor devices, the distance between elements is being shortened, and thus the area available for electrical isolation of the elements is also scaled down. As a result, it becomes difficult to prevent latch-up, which is a form of interference between adjacent elements, using conventional isolation techniques, such as a local oxidation of silicon (LOCOS) process or a trench isolation process.

To overcome these drawbacks, research on applications of a silicon-on-insulator (SOI) substrate has been conducted. The SOI substrate includes an insulating layer interposed between a silicon substrate and a top silicon layer. In forming a MOS transistor on the SOI substrate, the MOS transistor includes source/drain regions and a channel induced therebetween, which are disposed in a top silicon layer that is electrically isolated from the silicon substrate. Accordingly, the MOS transistor can be made to be free from latch-up. Further, when a fully depleted SOI substrate is fabricated by thinning the top silicon layer, the resultant MOS transistor can be improved in swing characteristics and off-current characteristics, which are subthreshold characteristics, and can obtain a high saturation current.

However, since the fabrication of the SOI substrate (especially, the fully depleted SOI substrate) involves forming the top silicon layer to a small thickness of several nm, the source/drain regions disposed in the top silicon layer are likewise reduced in thickness, thus impeding a subsequent silicidation process. As a result, the resultant MOS transistor may suffer from relatively high source/drain series resistance. In order to facilitate the foregoing silicidation process, an elevated source/drain structure can be employed by epitaxially growing a single crystalline silicon layer on the top silicon layer in which the source/drain regions are formed. However, in this case, agglomeration may arise in the top silicon layer formed on the insulating layer during the epitaxial growth of the single crystalline silicon layer.

Meanwhile, a fully depleted SOI MOS transistor for improving problems induced by the silicidation process is disclosed in U.S. Pat. No. 6,084,271 entitled "Transistor with Local Insulator Structure" by Yu et al. According to Yu et al., a local insulating layer is formed in a lower substrate using a LOCOS process, and an upper substrate is bonded onto the lower substrate having the local insulating layer using a wafer bonding process, thereby forming an SOI substrate. Thereafter, a MOS transistor is formed on the upper substrate. In this case, the local insulating layer is formed only under a channel of the MOS transistor but not under source/drain regions, so that the source/drain regions still have a sufficient thickness for a silicidation process. However, it undesirable that the wafer bonding process is required to form the local insulating layer. Also, while the MOS transistor is being formed on the upper substrate, the local insulating layer formed in the lower substrate may be incorrectly aligned with the channel of the MOS transistor.

SUMMARY OF THE INVENTION

An embodiment of the invention provides a method of fabricating a transistor, in which a buried insulating layer can be easily formed in a bulk substrate during the fabrication of the transistor in the bulk substrate.

Another embodiment of the invention provides a method of fabricating a transistor, which can prevent agglomeration from arising in silicon surfaces of source/drain regions during an epitaxial growth process for forming an elevated source/drain structure.

Still another embodiment of the invention provides a method of fabricating a transistor, in which a buried insulating layer is self-aligned under a channel and source/drain regions.

Yet another embodiment of the invention provides a method of fabricating a transistor, which can enhance the mobility of carriers in a channel.

Still yet another embodiment of the invention provides a transistor fabricated using the above-described methods.

In one aspect, the invention is directed to a method of fabricating a transistor. The method includes sequentially forming a sacrificial layer and a top semiconductor layer on a single crystalline semiconductor substrate. A gate pattern including a gate electrode is formed on the top semiconductor layer. A sacrificial spacer is formed to cover sidewalls of the gate pattern. An elevated semiconductor layer is grown on a portion of the top semiconductor layer adjacent to the sacrificial spacer. Next, the sacrificial spacer is removed. A portion of the top semiconductor layer from which the sacrificial spacer is removed is etched until the sacrificial layer is exposed, thereby forming a recess, which separates the top semiconductor layer into a first top semiconductor layer pattern remaining under the gate pattern and a second top semiconductor layer pattern remaining under the elevated semiconductor layer. Thereafter, the sacrificial layer is selectively removed. A buried insulating layer is formed to fill a region from which the sacrificial layer is removed. A buried semiconductor layer is grown in the recess such that it is in contact with the first top semiconductor layer pattern and the second top semiconductor layer pattern.

In one embodiment, the sacrificial layer may be formed of a semiconductor layer having an etch selectivity with respect to the semiconductor substrate and the top semiconductor layer. The sacrificial layer may be a silicon germanium layer, which is epitaxially grown on the semiconductor substrate, and the silicon germanium layer may be formed to a thickness of about 10 to 100 nm.

In another embodiment, the gate pattern may further include a gate insulating layer interposed between the top semiconductor layer and the gate electrode, and a capping layer pattern deposited on the gate electrode.

In still another embodiment, the top semiconductor layer may be a silicon layer, which is epitaxially grown on the sacrificial layer. The silicon layer may be formed to a thickness of about 5 to 50 nm.

In yet another embodiment, the elevated semiconductor layer may be a silicon layer, which is grown on the top semiconductor layer using a selective epitaxial growth process.

In yet another embodiment, the selectively removing the sacrificial layer comprises selectively wet etching the sacrificial layer.

In yet another embodiment, the buried insulating layer may be formed of a thermal oxide layer. In another case, the buried insulating layer may be formed of silicon oxide or silicon nitride using a chemical vapor deposition (CVD) process or an atomic layer deposition (ALD) process.

In yet another embodiment, growing the buried semiconductor layer may include selectively epitaxially growing a semiconductor layer from the surfaces of the first top semiconductor layer pattern and the second top semiconductor layer pattern, which are exposed by the recess. In this case, the buried semiconductor layer may be formed of a silicon (Si) layer, a silicon germanium (SiGe) layer, or a silicon carbide (SiC) layer.

In yet another embodiment, before forming the sacrificial spacer, a sidewall oxide layer may be formed to cover the sidewalls of the gate electrode. The sidewall oxide layer may be formed of a thermal oxide layer.

In yet another embodiment, after forming the recess, an additional sacrificial spacer may be formed to cover the sidewalls of the recess, the elevated semiconductor layer, and the gate pattern. In this case, the additional sacrificial spacer may be removed by a wet etching process after the buried insulating layer is formed. The additional sacrificial spacer may be formed of a silicon nitride layer.

In yet another embodiment, after forming the buried insulating layer, a portion of the buried insulating layer exposed by the recess may be selectively removed until the semiconductor substrate is exposed, thereby forming an extending recess, which separates the buried insulating layer into a first buried insulating layer pattern self-aligned under the first top semiconductor layer pattern and a second buried insulating layer pattern self-aligned under the second top semiconductor layer pattern. In this case, the buried semiconductor layer may be grown such that it is in contact with the first top semiconductor layer pattern, the second top semiconductor layer pattern, and the semiconductor substrate in the recess and the extending recess.

In yet another embodiment, forming the extending recess comprises etching the portion of the buried insulating layer exposed by the recess using a wet etching process or a dry etching process.

In yet another embodiment, growing the buried semiconductor layer comprises selectively epitaxially growing a semiconductor layer from the surfaces of the first top semiconductor layer pattern, the second top semiconductor layer pattern, and the semiconductor substrate, which are exposed by the recess and the extending recess.

In yet another embodiment, after forming the buried semiconductor layer, a lightly doped impurity layer may be formed by implanting impurity ions into the semiconductor substrate using the gate pattern as an ion implantation mask. A gate spacer may be formed to cover the sidewalls of the gate pattern. Impurity ions may be implanted into the semiconductor substrate using the gate pattern and the gate spacer as ion implantation masks, thereby forming a heavily doped impurity layer in the second top semiconductor layer pattern. Further, after forming the heavily doped impurity layer, a metal suicide layer may be formed on the elevated semiconductor layer.

In another aspect, the present invention is directed to a method of fabricating a transistor. A sacrificial layer and a top semiconductor layer are sequentially formed on a single crystalline semiconductor substrate. A gate pattern including a gate electrode is formed on the top semiconductor layer. A sacrificial spacer is formed to cover sidewalls of the gate pattern. An elevated semiconductor layer is grown on the top semiconductor layer at both sides of the sacrificial spacer. The sacrificial spacer is removed. A recess is formed by etching a portion of the top semiconductor layer from which the sacrificial spacer is removed until the sacrificial layer is exposed, the recess separating the top semiconductor layer into a first top semiconductor layer pattern remaining under the gate pattern and a second top semiconductor layer pattern remaining under the elevated semiconductor layer. The sacrificial layer is selectively removed. A buried insulating layer is formed to fill a region from which the sacrificial layer is removed. An extending recess is formed by selectively removing a portion of the buried insulating layer exposed by the recess until the semiconductor substrate is exposed, the extending recess separating the buried insulating layer into a first buried insulating layer pattern self-aligned under the first top semiconductor layer pattern and a second buried insulating layer pattern self-aligned under the second top semiconductor layer pattern. A buried semiconductor layer is grown in the recess and the extending recess, the buried semiconductor layer being in contact with the first top semiconductor layer pattern, the second top semiconductor layer pattern, and the semiconductor substrate.

In one embodiment, the gate pattern further comprises: a gate insulating layer interposed between the top semiconductor layer and the gate electrode; and a capping layer pattern deposited on the gate electrode.

In another embodiment, the method further comprises, before forming the sacrificial spacer, forming a sidewall oxide layer to cover the sidewalls of the gate electrode.

In another embodiment, the method further comprises, after forming the recess, forming an additional sacrificial spacer to cover the sidewalls of the recess, the elevated semiconductor layer, and the gate pattern, wherein the additional sacrificial spacer is removed by a wet etching process after the buried insulating layer is formed.

In another embodiment, the method further comprises: after forming the buried semiconductor layer, forming a lightly doped impurity layer by implanting impurity ions into the semiconductor substrate using the gate pattern as an ion implantation mask; forming a gate spacer to cover the sidewalls of the gate pattern; and forming a heavily doped impurity layer in the second top semiconductor layer pattern by implanting impurity ions into the semiconductor substrate using the gate pattern and the gate spacer as ion implantation masks.

In another embodiment, the method further comprises, after forming the heavily doped impurity layer, forming a metal silicide layer on the elevated semiconductor layer.

In another aspect, the present invention is directed to a transistor including a single crystalline semiconductor substrate. A first top semiconductor layer pattern is disposed on the semiconductor substrate. Second top semiconductor layer patterns are disposed on the semiconductor substrate and spaced apart from each other by the first top semiconductor layer pattern. A first buried insulating layer pattern is interposed between the first top semiconductor layer pattern and the semiconductor substrate. Second buried insulating layer patterns are interposed between the second top semiconductor layer patterns and the semiconductor substrate. Buried semiconductor layers are interposed between the first top semiconductor layer pattern and the second top semiconductor layer patterns and between the first buried insulating layer pattern and the second buried insulating layer patterns. The buried semiconductor layers are in contact with the semiconductor substrate. A gate pattern including a gate electrode is disposed on the first top semiconductor layer pattern. Source/drain regions are disposed in the buried semiconductor layers and the second top semiconductor layer patterns.

In one embodiment, the single crystalline semiconductor substrate may be a single crystalline silicon substrate.

In another embodiment, the first top semiconductor layer pattern and the second top semiconductor layer patterns may be single crystalline silicon layer patterns. In this case, each of the single crystalline silicon layer patterns may have a thickness of about 5 to 50 nm.

In still another embodiment, the first buried insulating layer pattern and the second buried insulating layer patterns may be formed of a silicon oxide layer or a silicon nitride layer. The first buried insulating layer pattern and the second buried insulating layer patterns may be formed of a thermal oxide layer.

In yet another embodiment, each of the first buried insulating layer pattern and the second buried insulating layer patterns may have a thickness of about 10 to 100 nm.

In yet another embodiment, the buried semiconductor layers may be single crystalline semiconductor layers, which are grown by a selective epitaxial growth process. In this case, the buried semiconductor layers may be silicon layers, silicon germanium layers, or silicon carbide layers.

In yet another embodiment, the gate pattern may further include a gate insulating layer interposed between the gate electrode and the first top semiconductor layer pattern, and a capping layer pattern deposited on the gate electrode.

In yet another embodiment, the transistor may further include a gate spacer disposed on the buried semiconductor layers and covering the sidewalls of the gate pattern, a sidewall oxide layer interposed between the gate spacer and the gate electrode, and elevated semiconductor layers grown on the second top semiconductor layer patterns. The elevated semiconductor layers may be single crystalline silicon layers, which are grown using a selective epitaxial growth process. Further, the transistor may further include metal silicide layers disposed on the elevated semiconductor layers.

In another aspect, the present invention is directed to a MOS transistor. The transistor includes a single crystalline semiconductor substrate and a first top semiconductor layer pattern disposed on the semiconductor substrate. Second top semiconductor layer patterns are disposed on the semiconductor substrate at opposite sides of and spaced apart from the first top semiconductor layer pattern. Buried semiconductor layers are interposed between the first top semiconductor layer pattern and the second top semiconductor layer patterns. A buried insulating layer is interposed between the semiconductor substrate and the first top semiconductor layer pattern, between the semiconductor substrate and the buried semiconductor layers, and between the semiconductor substrate and the second top semiconductor layer patterns. A gate pattern is disposed on the first top semiconductor layer pattern and including a gate electrode. A gate spacer is disposed on the buried semiconductor layers and covering sidewalls of the gate pattern. A sidewall oxide layer is interposed between the gate spacer and the gate electrode. Elevated semiconductor layers is disposed on at least the second top semiconductor layer patterns. Source/drain regions are formed in the buried semiconductor layers, the elevated semiconductor layers, and the second top semiconductor layer patterns.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

DETAILED DESCRIPTION OF THE INVENTION

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. In the drawings, the thicknesses of layers and regions are exaggerated for clarity. The same reference numerals are used to denote the same elements.

FIGS. 1 through 11 are cross-sectional views illustrating a method of fabricating a MOS transistor according to an exemplary embodiment of the present invention.

Figure 1:
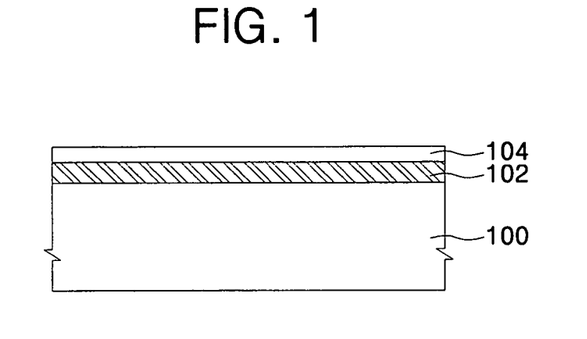
FIGS. 1 through 11 are cross-sectional views illustrating a method of fabricating a MOS transistor according to an exemplary embodiment of the present invention.

Referring to FIG. 1, a sacrificial layer 102 and a top semiconductor layer 104 are sequentially formed on a single crystalline semiconductor substrate 100. The single crystalline semiconductor substrate 100 may be, for example, a single crystalline silicon substrate. Also, the semiconductor substrate 100 may be a P-type semiconductor substrate doped with impurity ions of a first conductivity type, for example, P type. The sacrificial layer 102 may be a semiconductor layer having wet etching selectivity to the semiconductor substrate 100 and the top semiconductor layer 104. In this case, the sacrificial layer 102 may be a silicon germanium (SiGe) layer, which is epitaxially grown on the semiconductor substrate 100. The sacrificial layer 102 may be removed in a subsequent process such that a buried insulating layer is formed in a region where the sacrificial layer 102 is removed. Accordingly, the thickness of the sacrificial layer 102 may be determined by considering the thickness of the buried insulating layer. Also, when the sacrificial layer 102 is a SiGe layer, it may be formed within such a range of thickness that strain relaxation does not arise from a lattice constant difference between the SiGe layer and the single crystalline silicon substrate 100. That is, the SiGe sacrificial layer may be formed to a thickness of about 10 to 100 nm. In this case, the concentration of Ge in the SiGe layer may be about 10 to 40%.

The top semiconductor layer 104 may be a single crystalline silicon layer, which is epitaxially grown on the sacrificial layer 102. The top semiconductor layer 104 may be formed to a thickness of about 5 to 50 nm in order that a MOS transistor, which will be formed on the top semiconductor layer 104 in a subsequent process, may have a fully depleted channel.

Figure 2:
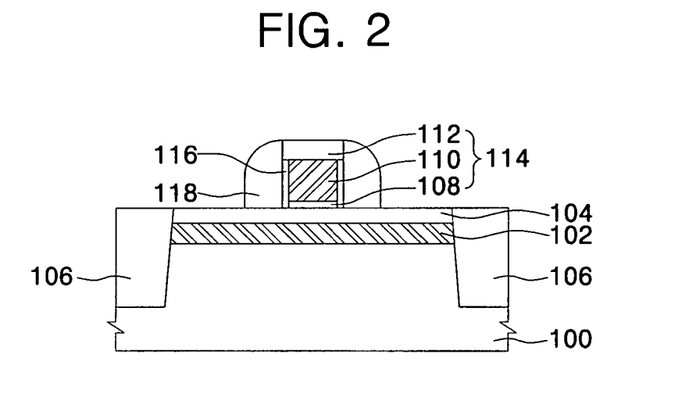

Referring to FIG. 2, an isolation layer 106 is formed using a typical isolation process to define an active region in the semiconductor substrate 100 having the sacrificial layer 102 and the top semiconductor layer 104. The isolation layer 106 may be formed using a shallow trench isolation (STI) technique. Thereafter, impurity ions may be implanted into the top semiconductor layer 104 in order to control the threshold voltage of the MOS transistor. Next, a gate pattern 114 is formed on the top semiconductor layer 104. More specifically, a gate insulating layer 108 is formed on the top semiconductor layer 104, which is isolated by the isolation layer 106. The gate insulating layer 108 may be formed of a thermal oxide layer. In another case, the gate insulating layer 108 may be formed of a high-k insulating layer. In this case, the high-k dielectric layer may be an aluminum oxide (AlO) layer, a hafnium oxide (HfO) layer, a zirconium oxide (ZrO) layer, a lanthanum oxide (LaO) layer, a hafnium silicon oxide (HfSiO) layer, a hafnium aluminum oxide (HfAlO) layer, a titanium oxide (TiO) layer, a tantalum oxide (TaO) layer, or a laminated layer thereof. A gate conductive layer and a capping layer are sequentially formed on the gate insulating layer 108. The gate conductive layer may be a polysilicon layer, and the capping layer may be formed of silicon nitride or silicon oxide using a chemical vapor deposition (CVD) process. Thereafter, the capping layer and the gate conductive layer are sequentially patterned using typical photolithography and etching processes, thereby forming a gate electrode 110 and a capping layer pattern 112. In this case, the gate insulating layer 108, the gate electrode 110, and the capping layer pattern 112 constitute the gate pattern 114.

After the gate pattern 114 is formed, a reoxidation process may be performed to cure the damage inflicted on the surface of the top semiconductor layer 114 and the gate insulating layer 108 during the etching process for forming the gate pattern 114. The reoxidation process may a thermal oxidation process, which is performed in a furnace maintained at a temperature of about 800° C. or higher, or a plasma oxidation process, which is conducted at a relatively low temperature. By performing the reoxidation process, a sidewall oxide layer 116 is formed on sidewalls of the gate electrode 110. When the reoxidation process is the thermal oxidation process, the sidewall oxide layer 116 may be a thermal oxide layer. Thereafter, a sacrificial spacer 118 is formed through a deposition process and a blanket anisotropic etching process to cover the sidewalls of the gate pattern 114 on which the sidewall oxide layer 116 is formed. The sacrificial spacer 118 may be formed of silicon nitride or silicon oxide.

Figure 3:
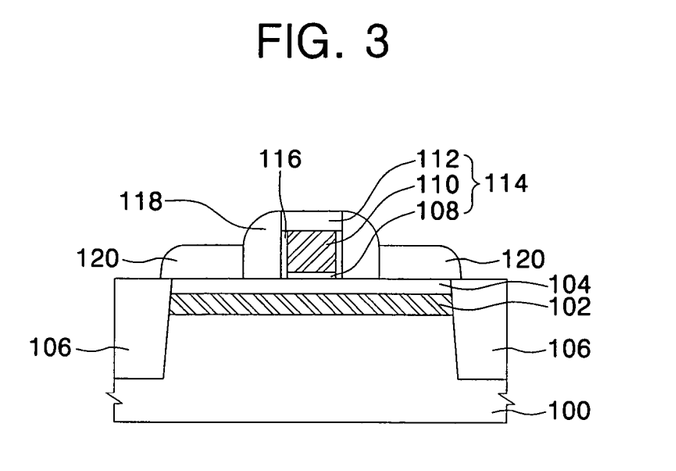

Referring to FIG. 3, elevated semiconductor layers 120 are grown on portions of the top semiconductor layer 104, which are adjacent to the sacrificial spacer 118. The elevated semiconductor layers 120 may be obtained by growing a single crystalline silicon layer, a single crystalline silicon germanium layer, or a single crystalline silicon carbide layer using a selective epitaxial growth process. In a subsequent etching process for forming recesses, upper portions of the elevated semiconductor layers 120 may be etched together. Accordingly, the elevated semiconductor layers 120 may be formed considering the thickness that is to be reduced in the foregoing etching process. That is, the elevated semiconductor layers 120 may be formed to a thickness of about 20 to 100 nm. Meanwhile, according to the embodiments of the present invention, the top semiconductor layer 120 is epitaxially grown on the SiGe layer provided as the sacrificial layer 102 as described above. Accordingly, an interfacial surface between the top semiconductor layer 120 and the SiGe layer has robust adhesion characteristics. As a result, even if the top semiconductor layer 104 has a small thickness, agglomeration seldom arises in the top semiconductor layer 104 during the epitaxial growth of the elevated semiconductor layers 120.

Figure 4:
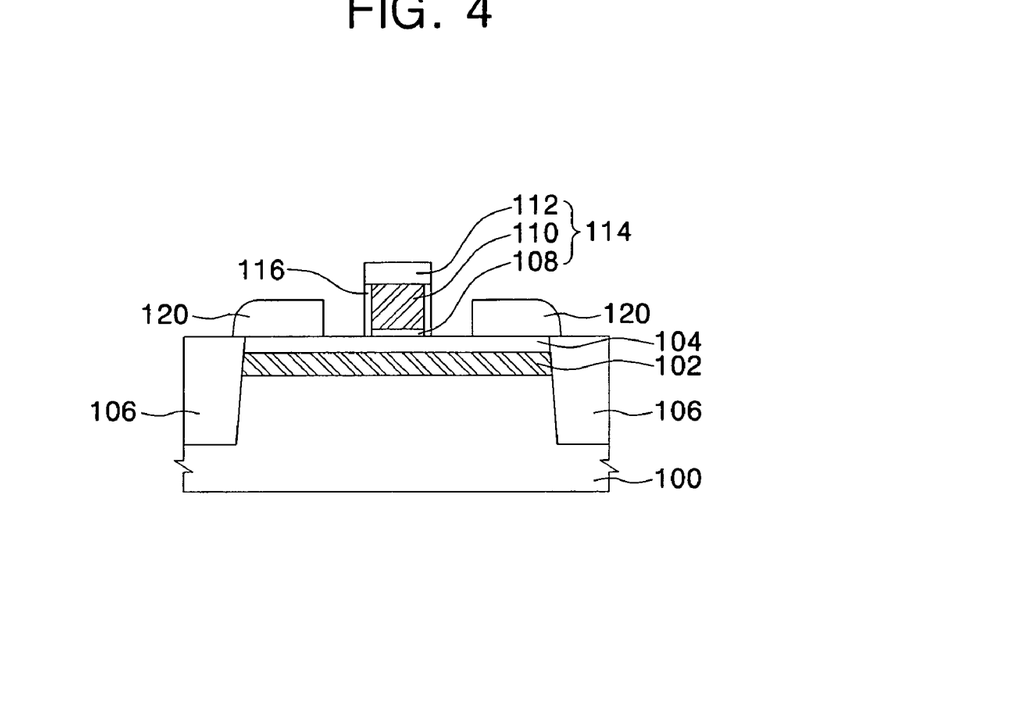

Referring to FIG. 4, after the elevated semiconductor layers 120 are formed, the sacrificial spacer 118 is selectively removed. For example, when the sacrificial spacer 118 is formed of silicon nitride, it may be removed by a wet etching process using a phosphoric acid ($H_3PO_4$)-containing solution as an etchant.

Figure 5:
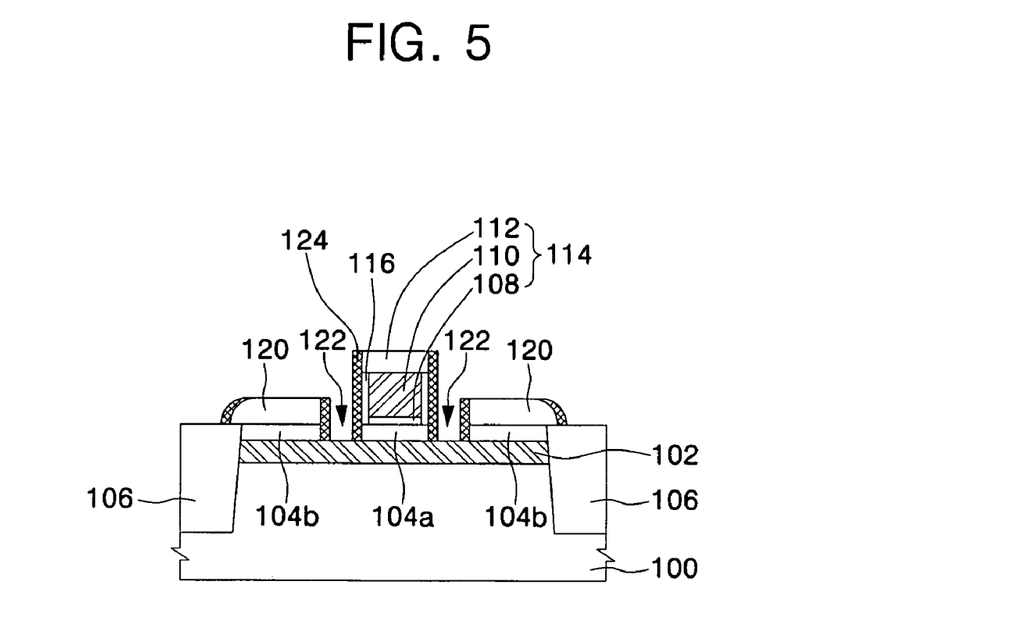

Referring to FIG. 5, a portion of the top semiconductor layer 104 from which the sacrificial spacer 118 is removed is etched until the sacrificial layer 102 is exposed, thereby forming recesses 122 on both sides of the gate pattern 114. More specifically, the resultant structure from which the sacrificial spacer 118 is removed is etched by a blanket anisotropic etching process. The blanket anisotropic etching process may be a silicon dry etching process using a reactive ion etch (RIE) process. During the dry etching process, the isolation layer 106 and the capping layer pattern 112 may be provided as etch masks. As a result, a region from which the sacrificial spacer 118 is removed (i.e., portions of the top semiconductor layer 104 exposed between the gate pattern 114 and the elevated semiconductor layers 120) is etched to form the recesses 122 that expose the sacrificial layer 102. Also, the recesses 122 separate the top semiconductor layer 104 into a first top semiconductor layer pattern 104a, which remains under the gate pattern 114, and second top semiconductor layer patterns 104b, which remain under the elevated semiconductor layers 120. The recesses 122 may be formed to a depth of about 10 to 100 nm. As described above, the upper portions of the elevated semiconductor layers 120 are etched during the formation of the recesses 122, and thus the elevated semiconductor layers 120 may be reduced in thickness.

Subsequently, an additional sacrificial spacer 124 may be formed on the sidewalls of the recesses 122, the elevated semiconductor layers 120, and the gate pattern 114. The additional sacrificial spacer 124 may be obtained by depositing a silicon nitride layer or a silicon oxide layer and then etching the same using a blanket anisotropic etching process.

Figure 6:
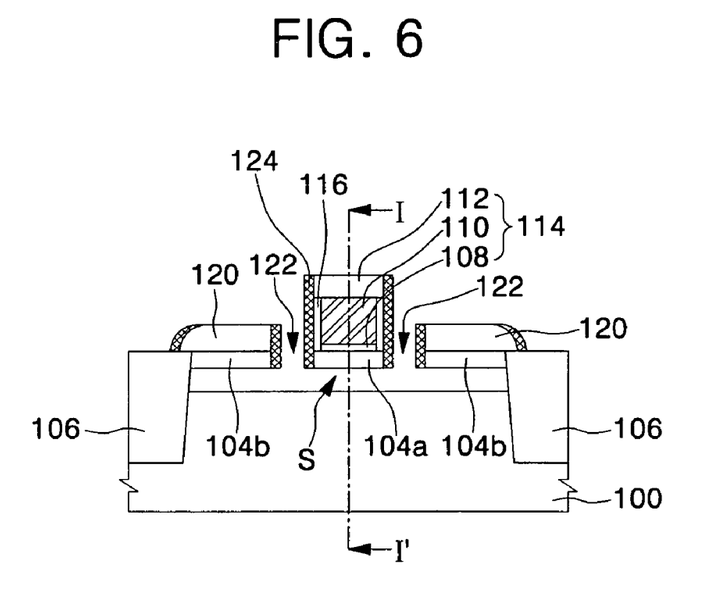
Figure 7:
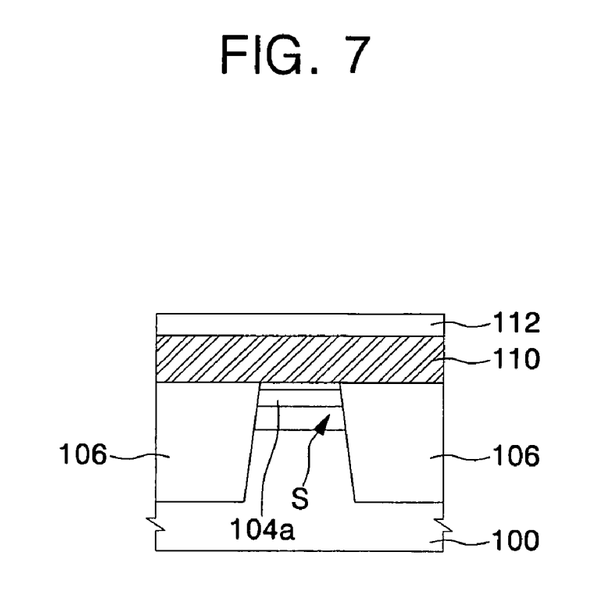

Referring to FIGS. 6 and 7, the sacrificial layer 102 is selectively removed through the recesses 122. As described above, the sacrificial layer 102 may be a single crystalline silicon germanium layer with etch selectivity to a single crystalline silicon layer. In this case, the silicon germanium layer, which is used as the sacrificial layer 102, may be selectively removed by a wet etching process using a solution containing hydrogen peroxide ($H_2O_2$), phosphoric acid ($H_3PO_4$), and nitric acid ($HNO_3$) as an etchant. By selectively removing the sacrificial layer 102, a space S is formed in a region from which the sacrificial layer 102 is removed. Meanwhile, FIGS. 6 and 7 illustrate the same operation, and FIG. 7 is a cross-sectional view taken along line I-I' of FIG. 6.

Figure 8:
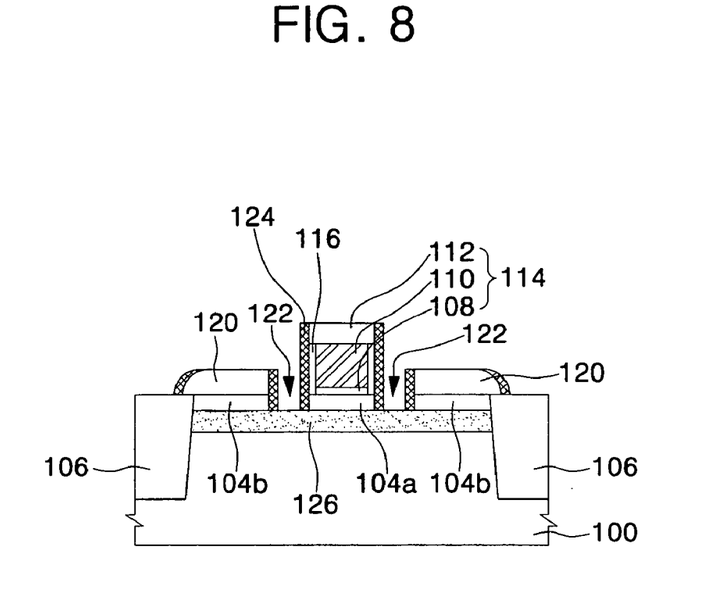

Referring to FIG. 8, a buried insulating layer 126 is formed to fill the space S. The buried insulating layer 126 may be formed of silicon oxide or silicon nitride using a CVD process or an atomic layer deposition (ALD) process. In another case, the buried insulating layer 126 may be formed of a thermal oxide layer. Here, the buried insulating layer 126 is preferably formed of the thermal oxide layer to effectively fill the space S. Meanwhile, when the thermal oxide layer is formed as the buried insulating layer 126, it may also be formed on the top surfaces of the elevated semiconductor layers 120. Also, when the buried insulating layer 126 is deposited, a silicon oxide layer or a silicon nitride layer may be deposited not only in the space S but also on the entire surface of the resultant structure shown in FIG. 8. In this case, an additional wet etching process may be carried out to remove an undesired insulating layer deposited on regions other than the space S. Further, by forming the additional sacrificial spacer 124 as described with reference to FIG. 5, it is possible to prevent an insulating layer from being formed on the sidewalls of the recesses 122 and the elevated semiconductor layers 120 during the formation of the buried insulating layer 126. Accordingly, if the foregoing additional wet etching process is performed to remove the insulating layer formed on the sidewalls of the recesses 122 and the elevated semiconductor layers 120, the process of forming the additional sacrificial spacer 124 may be omitted.

Figure 9:
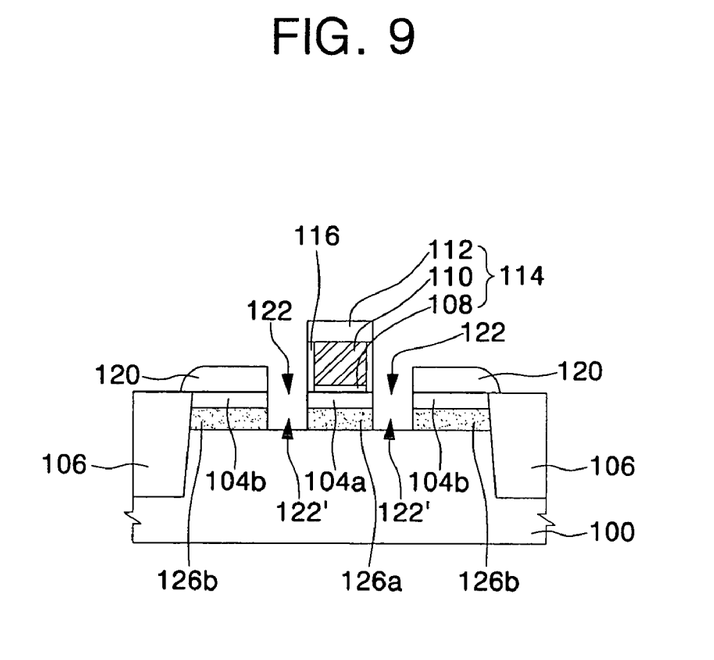

Referring to FIG. 9, in the case where the additional sacrificial spacer 124 is formed, it is selectively removed using a wet etching process. Thereafter, the buried insulating layer 126, which is disposed in the portions exposed by the recesses 122, is removed until the semiconductor substrate 100 is exposed, thereby forming extending recesses 122'. The extending recesses 122' separate the buried insulating layer 126 into a first buried insulating layer pattern 126a, which is self-aligned under the first top semiconductor layer pattern 104a, and second buried insulating layer patterns 126b, which are self-aligned under the second top semiconductor layer patterns 104b. The extending recesses 122' may be formed using a wet etching process or a dry etching process. More specifically, the extending recesses 122' may be formed using the additional wet etching process as described with reference to FIG. 8. In other words, the extending recesses 122' may be formed while the additional wet etching process is being carried out to remove the undesired insulating layer formed on the regions other than the space S during the formation of the buried insulating layer 126. In another case, the extending recesses 122' may be formed using a dry etching process. That is, after the buried insulating layer 126 is formed to fill the space S, the extending recesses 122' may be obtained by dry etching the portions of the buried insulating layer 126, which are exposed by the recesses 122. In this case, the dry etching process may be an RIE process, which may selectively remove the buried insulating layer 126.

Figure 10:
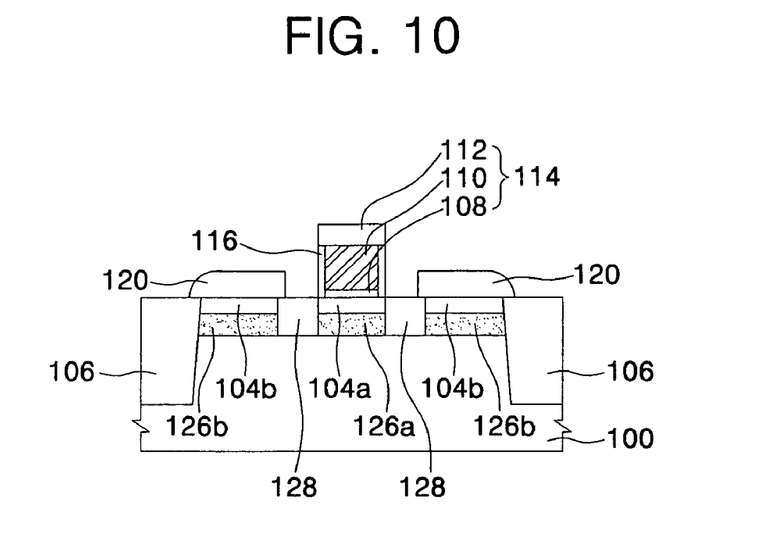

Referring to FIG. 10, buried semiconductor layers 128 are grown in the recesses 122 and the extending recesses 122'. The buried semiconductor layers 128 may be formed of a single crystalline silicon layer, a single crystalline silicon germanium layer, or a single crystalline silicon carbide layer, which is grown by a selective epitaxial growth process. In other words, the buried semiconductor layers 128 can be obtained by selectively epitaxially growing the single crystalline semiconductor layers from the surfaces of the first top semiconductor layer pattern 104a, the second top semiconductor layer patterns 104b, and the semiconductor substrate 100, which are exposed by the recesses 122 and the extending recesses 122'. In this process, the elevated semiconductor layers 120 also may be isotropically grown. However, while the buried semiconductor layers 128 are being grown in three directions to fill the recesses 122 and the extending recesses 122' as described above, the elevated semiconductor layers 120 may be grown to a smaller extent than the buried semiconductor layers 128.

Figure 11:
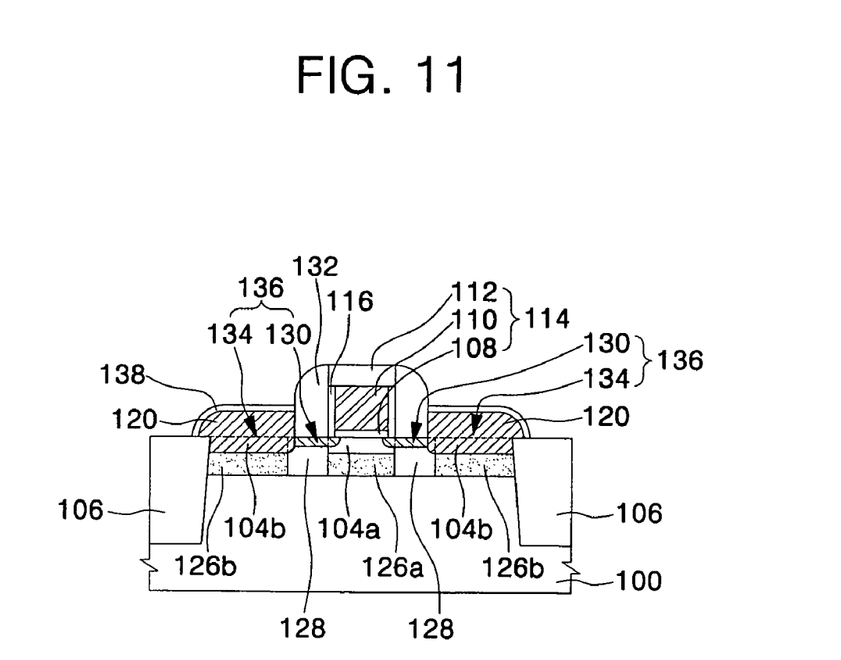

Referring to FIG. 11, impurity ions of a second conductivity type, for example, N type, are implanted into the semiconductor substrate 100 having the buried semiconductor layers 128 using the gate pattern 114 as an ion implantation mask, thereby forming lightly doped impurity layers 130. Further, a halo ion implantation process may be further performed to prevent punch-through. Subsequently, a gate spacer 132 may be formed on the sidewalls of the gate pattern 114. When the sidewall oxide layer 116 is formed as described above, the gate spacer 132 may be formed to cover the sidewall oxide layer 116. To form the gate spacer 132, a silicon nitride layer may be deposited and etched using a blanket anisotropic etching process. As can be seen from FIG. 11, the gate spacer 132 may be formed to fill spaces between the gate pattern 114 and the elevated semiconductor layers 120.

Thereafter, impurity ions of the second conductivity type, for example, N type, are heavily implanted into the semiconductor substrate 100 using the gate pattern 114 and the gate spacer 132 as ion implantation masks. Thus, heavily doped impurity layers 134 are formed in the second top semiconductor layers 104b and the elevated semiconductor layers 120. The lightly doped impurity layers 130 and the heavily doped impurity layers 134 constitute lightly doped drain (LDD) source/drain regions 136. After that, metal silicide layers 138 may be selectively formed on the elevated semiconductor layers 120 through a typical silicide process.

According to the present invention as stated above, the recesses 122 are formed to separate the top semiconductor layers 104 into the first top semiconductor layer pattern 104a and the second top semiconductor layer patterns 104b, and the extending recesses 122', which extend from the recesses 122, are formed to separate the buried insulating layer 126 into the first buried insulating layer pattern 126a and the second buried insulating layer patterns 126b. As a result, the first buried insulating layer pattern 126a is self-aligned to the first top semiconductor layer pattern 104a in which a channel is induced, while the second buried insulating layer patterns 126b are self-aligned to the second top semiconductor layer patterns 104b in which the source/drain regions 136 are formed. Hence, misalignment between a buried insulating layer and a channel or misalignment between the buried insulating layer and source/drain regions can be prevented in comparison to conventional methods.

Further, according to the present invention, the buried semiconductor layers 128 may be formed of a semiconductor layer having a different lattice constant from the first top semiconductor layer pattern 104a in which the channel for the MOS transistor is induced. For instance, when the first top semiconductor layer pattern 104a is formed of a single crystalline silicon layer, the buried semiconductor layers 128 may be formed of a single crystalline silicon germanium layer or a single crystalline silicon carbide layer. As a result, uniaxial strain is applied to the first top semiconductor layer pattern 104a due to a lattice constant difference between the first top semiconductor layer pattern 104a and the buried semiconductor layers 128, so that the mobility of carriers can be enhanced in the channel induced in the first top semiconductor layer pattern 104a.

Hereinafter, the structure of a MOS transistor according to an exemplary embodiment of the present invention will be described with reference to FIG. 11.

Referring again to FIG. 11, a first top semiconductor layer pattern 104a and second top semiconductor layer patterns 104b are disposed on a single crystalline semiconductor substrate 100. The single crystalline semiconductor substrate 100 may be a single crystalline silicon substrate doped with impurity ions of a first conductivity type, for example, P type. The first top semiconductor layer pattern 104a and the second top semiconductor layer patterns 104b may be formed of an epitaxially grown single crystalline silicon layer. The second top semiconductor layer patterns 104b are spaced apart from each other by the first top semiconductor layer pattern 104a. The first top semiconductor layer pattern 104a and the second top semiconductor layer patterns 104b are disposed on the same level of the semiconductor substrate 100 and may be about 5 to 50 nm in thickness.

A first buried insulating layer pattern 126a is interposed between the first top semiconductor layer pattern 104a and the semiconductor substrate 100, and second buried insulating layer patterns 126b are interposed between the second top semiconductor layer patterns 104b and the semiconductor substrate 100. The first buried insulating layer pattern 126a and the second buried insulating layer patterns 126b are self-aligned to the first top semiconductor layer pattern 104a and the second top semiconductor layer patterns 104b, respectively. The first buried insulating layer pattern 126a and the second buried insulating layer patterns 126b may be formed of silicon oxide or silicon nitride using a CVD process or an ALD process. In another case, the first buried insulating layer pattern 126a and the second buried insulating layer patterns 126b may be formed of a thermal oxide layer. The first buried insulating layer pattern 126a and the second buried insulating layer patterns 126b may be about 10 to 100 nm in thickness.

Buried semiconductor layers 128 are interposed between the first top semiconductor layer pattern 104a and the second top semiconductor layer patterns 104b and between the first buried insulating layer pattern 126a and the second buried insulating layer patterns 126b. The buried semiconductor layers 128 are in contact with the first top semiconductor layer pattern 104a, the second top semiconductor layer patterns 104b, and the semiconductor substrate 100. The buried semiconductor layers 128 may be formed of a silicon layer, a silicon germanium layer, or a silicon carbide layer, which is grown by a selective epitaxial growth process.

A gate pattern 114 is disposed on the first top semiconductor layer pattern 104a. The gate pattern 114 may include a gate insulating layer 108, a gate electrode 110, and a capping layer pattern 112, which are sequentially laminated. The gate insulating layer 108 may be a thermal oxide layer or a high-k dielectric layer. In this case, the high-k dielectric layer may be an aluminum oxide (AlO) layer, a hafnium oxide (HfO) layer, a zirconium oxide (ZrO) layer, a lanthanum oxide (LaO) layer, a hafnium silicon oxide (HfSiO) layer, a hafnium aluminum oxide (HfAlO) layer, a titanium oxide (TiO) layer, a tantalum oxide (TaO) layer, or a laminated layer thereof. The gate electrode 110 may be a polysilicon electrode, and the capping layer pattern 112 may be a silicon oxide layer or a silicon nitride layer. The sidewalls of the gate electrode 110 may be covered with a sidewall oxide layer 116. The sidewall oxide layer 116 may be a thermal oxide layer. A gate spacer 132, which covers the sidewalls of the gate pattern 114, may be disposed on the buried semiconductor layers 128. The gate spacer 132 may be formed of silicon nitride. When the sidewalls of the gate electrode 110 are covered with the sidewall oxide layer 116, the gate spacer 132 may cover the sidewall oxide layer 116.

Elevated semiconductor layers 120 are disposed on the second top semiconductor layer patterns 104b adjacent to the gate spacer 132. The elevated semiconductor layers 120 may be single crystalline silicon layers, which are grown on the second top semiconductor layer patterns 104b using a selective epitaxial growth process. The elevated semiconductor layers 120 may be disposed on the second top semiconductor layer patterns 104b and then extend onto predetermined portions of the buried semiconductor layers 128. In this case, the gate spacer 132 may be disposed between the gate pattern 114 and the elevated semiconductor layers 120. Metal silicide layers 138, which are obtained using a typical silicide process, may be disposed on the elevated semiconductor layers 120.

Lightly doped impurity layers 130 are disposed in the surfaces of the buried semiconductor layers 128. The lightly doped impurity layers 130 may be diffusion layers formed of impurity ions of a second conductivity type, for example, N type. The lightly doped impurity layers 130 may extend into predetermined portions of the first top semiconductor layer pattern 104a. Heavily doped impurity layers 134 are disposed in the second top semiconductor layer patterns 126b and the elevated semiconductor layers 120. Like the lightly doped impurity layers 130, the heavily doped impurity layers 134 may be diffusion layers formed of the second conductivity type, for example, N type. The heavily doped impurity layers 134 may extend into predetermined portions of the buried semiconductor layers 128. The lightly doped impurity layers 130 and the heavily doped impurity layers 134 constitute LDD source/drain regions 136.

Figure 12:
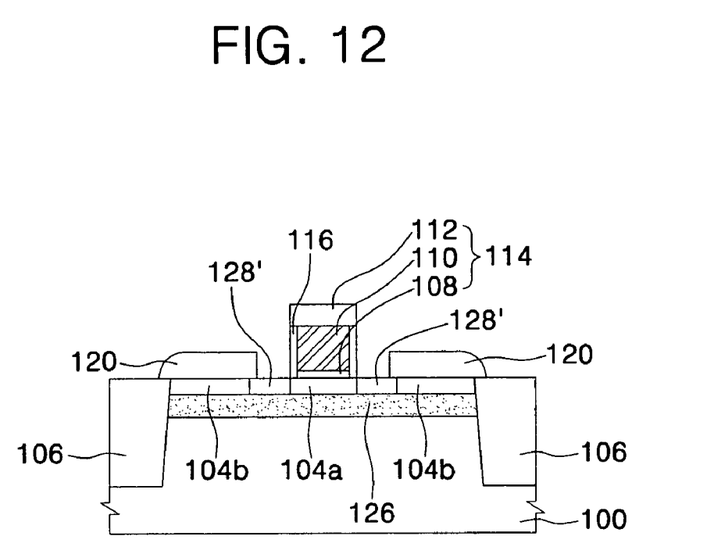
FIGS. 12 and 13 are cross-sectional views illustrating a method of fabricating a MOS transistor according to another exemplary embodiment of the present invention.
Figure 13:
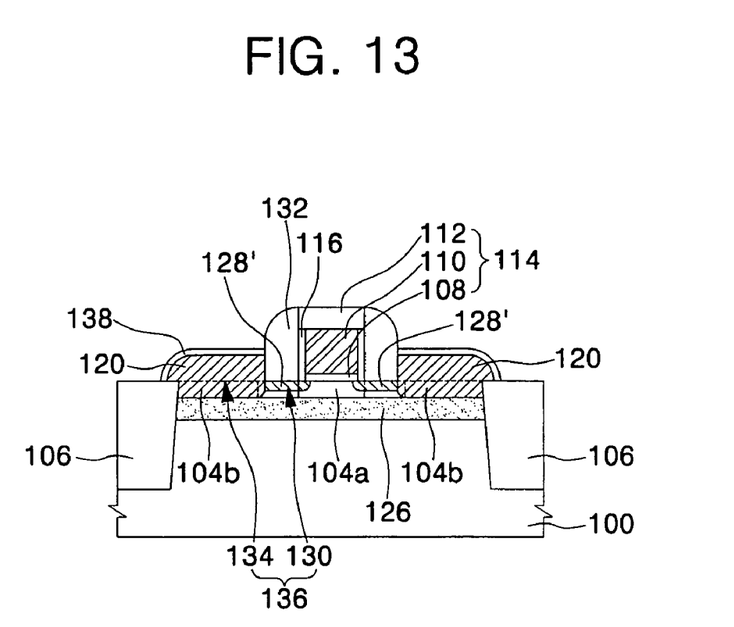

FIGS. 12 and 13 are cross-sectional views illustrating a method of fabricating a MOS transistor according to another exemplary embodiment of the present invention.

In the present embodiment, a process of forming the extending recesses 122' is omitted, unlike in the first embodiment described above.

Referring to FIGS. 12 and 13, the processes described with reference to FIGS. 1 through 8 are performed, thereby forming a buried insulating layer 126 in a space S. Thereafter, when an additional sacrificial spacer 124 is formed, it is selectively removed using a wet etching process. Then, buried semiconductor layers 128' are grown in recesses 122. The buried semiconductor layers 128' may be formed of a single crystalline silicon layer, a singe crystalline silicon germanium layer, or a single crystalline silicon carbide layer, which is selectively epitaxially grown as described with reference to FIG. 10. After the buried semiconductor layers 128' are formed, the same processes as described with reference to FIG. 11 are performed, thereby fabricating a MOS transistor.

In the present embodiment, the buried semiconductor layers 128' are formed between the first top semiconductor layer pattern 104a and the second top semiconductor layer patterns 104b such that they are in contact with the first top semiconductor layer pattern 104a and the second top semiconductor layer patterns 104b. Also, the buried semiconductor layers 128' are spaced apart from the semiconductor substrate 100 by the buried insulating layer 126. In other words, the first top semiconductor layer pattern 104a and the second top semiconductor layer patterns 104b, which are spaced apart from each other by the first top semiconductor layer pattern 104a, are disposed on the same level of the semiconductor substrate 100, and the buried semiconductor layers 128' are interposed between the first top semiconductor layer pattern 104a and the second top semiconductor layer patterns 104b. The buried insulating layer 126 is sequentially interposed between the first top semiconductor layer pattern 104a and the semiconductor substrate 100, between the buried semiconductor layers 128' and the semiconductor substrate 100, and between the second top semiconductor layer patterns 104b and the semiconductor substrate 100. Thus, the buried insulating layer 126 separates the first top semiconductor layer pattern 104a, the second top semiconductor layer patterns 104b, and the buried semiconductor layers 128' from the semiconductor substrate 100.

As can be seen from the foregoing, the present invention can suppress the generation of agglomeration in silicon surfaces of source/drain regions during the epitaxial growth process for forming an elevated source/drain structure. Also, a buried insulating layer can be formed in a self-aligned manner under a channel and source/drain regions of a transistor. Further, a silicon germanium layer or a silicon carbide layer having a different lattice constant from that of a silicon layer is formed on both sides of the silicon layer in which the channel of the transistor is induced. Thus, unaxial strain is applied to the silicon layer due to the lattice constant difference, so that the mobility of carriers can be enhanced in the channel.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of fabricating a transistor, comprising:
sequentially forming a sacrificial layer and a top semiconductor layer on a single crystalline semiconductor substrate;
forming a gate pattern including a gate electrode on the top semiconductor layer;
forming a sacrificial spacer to cover sidewalls of the gate pattern;
growing an elevated semiconductor layer on a portion of the top semiconductor layer adjacent to the sacrificial spacer;
removing the sacrificial spacer;
forming a recess by etching a portion of the top semiconductor layer from which the sacrificial spacer is removed until the sacrificial layer is exposed, the recess separating the top semiconductor layer into a first top semiconductor layer pattern remaining under the gate pattern and a second top semiconductor layer pattern remaining under the elevated semiconductor layer;
selectively removing the sacrificial layer;
forming a buried insulating layer to fill a region from which the sacrificial layer is removed; and
growing a buried semiconductor layer in the recess, the buried semiconductor layer being in contact with the first top semiconductor layer pattern and the second top semiconductor layer pattern.

2. The method according to claim 1, wherein the sacrificial layer is formed of a semiconductor layer having an etch selectivity with respect to the semiconductor substrate and the top semiconductor layer.

3. The method according to claim 2, wherein the sacrificial layer is a silicon germanium layer, which is epitaxially grown on the semiconductor substrate.

4. The method according to claim 3, wherein the silicon germanium layer is formed to a thickness of about 10 to 100 nm.

5. The method according to claim 1, wherein the gate pattern further includes:
a gate insulating layer interposed between the top semiconductor layer and the gate electrode; and
a capping layer pattern deposited on the gate electrode.

6. The method according to claim 1, wherein the top semiconductor layer is a silicon layer, which is epitaxially grown on the sacrificial layer.

7. The method according to claim 6, wherein the silicon layer is formed to a thickness of about 5 to 50 nm.

8. The method according to claim 1, wherein the elevated semiconductor layer is a silicon layer, which is grown on the top semiconductor layer using a selective epitaxial growth process.

9. The method according to claim 1, wherein forming the recess comprises performing an anisotropic etching process.

10. The method according to claim 1, wherein selectively removing the sacrificial layer comprises selectively wet etching the sacrificial layer.

11. The method according to claim 1, wherein the buried insulating layer is formed of a thermal oxide layer.

12. The method according to claim 1, wherein the buried insulating layer is formed of silicon oxide or silicon nitride using a chemical vapor deposition process or an atomic layer deposition process.

13. The method according to claim 1, wherein growing the buried semiconductor layer comprises selectively epitaxially growing a semiconductor layer from the surfaces of the first top semiconductor layer pattern and the second top semiconductor layer pattern, which are exposed by the recess.

14. The method according to claim 1, wherein the buried semiconductor layer is formed of a silicon layer, a silicon germanium layer, or a silicon carbide layer.

15. The method according to claim 1, further comprising, before forming the sacrificial spacer, forming a sidewall oxide layer to cover the sidewalls of the gate electrode.

16. The method according to claim 15, wherein the sidewall oxide layer is formed of a thermal oxide layer.

17. The method according to claim 1, further comprising, after forming the recess, forming an additional sacrificial spacer to cover the sidewalls of the recess, the elevated semiconductor layer, and the gate pattern,
wherein the additional sacrificial spacer is removed by a wet etching process after the buried insulating layer is formed.

18. The method according to claim 17, wherein the additional sacrificial spacer is formed of a silicon nitride layer.

19. The method according to claim 1, further comprising, after forming the buried insulating layer, forming an extending recess by selectively removing a portion of the buried insulating layer exposed by the recess until the semiconductor substrate is exposed, the extending recess separating the buried insulating layer into a first buried insulating layer pattern self-aligned under the first top semiconductor layer pattern and a second buried insulating layer pattern self-aligned under the second top semiconductor layer pattern,
wherein the buried semiconductor layer is grown to be contact with the first top semiconductor layer pattern, the second top semiconductor layer pattern, and the semiconductor substrate in the recess and the extending recess.

20. The method according to claim 19, wherein forming the extending recess comprises etching the portion of the buried insulating layer exposed by the recess using a wet etching process or a dry etching process.

21. The method according to claim 19, wherein growing the buried semiconductor layer comprises selectively epitaxially growing a semiconductor layer from the surfaces of the first top semiconductor layer pattern, the second top semiconductor layer pattern, and the semiconductor substrate, which are exposed by the recess and the extending recess.

22. The method according to claim 1, further comprising:
after forming the buried semiconductor layer,
forming a lightly doped impurity layer by implanting impurity ions into the semiconductor substrate using the gate pattern as an ion implantation mask;
forming a gate spacer to cover the sidewalls of the gate pattern; and
forming a heavily doped impurity layer in the second top semiconductor layer pattern by implanting impurity ions into the semiconductor substrate using the gate pattern and the gate spacer as ion implantation masks.

23. The method according to claim 22, further comprising, after forming the heavily doped impurity layer, forming a metal silicide layer on the elevated semiconductor layer.

24. A method of fabricating a transistor, comprising:

sequentially forming a sacrificial layer and a top semiconductor layer on a single crystalline semiconductor substrate;

forming a gate pattern including a gate electrode on the top semiconductor layer;

forming a sacrificial spacer to cover sidewalls of the gate pattern;

growing an elevated semiconductor layer on the top semiconductor layer at both sides of the sacrificial spacer;

removing the sacrificial spacer;

forming a recess by etching a portion of the top semiconductor layer from which the sacrificial spacer is removed until the sacrificial layer is exposed, the recess separating the top semiconductor layer into a first top semiconductor layer pattern remaining under the gate pattern and a second top semiconductor layer pattern remaining under the elevated semiconductor layer;

selectively removing the sacrificial layer;

forming a buried insulating layer to fill a region from which the sacrificial layer is removed;

forming an extending recess by selectively removing a portion of the buried insulating layer exposed by the recess until the semiconductor substrate is exposed, the extending recess separating the buried insulating layer into a first buried insulating layer pattern self-aligned under the first top semiconductor layer pattern and a second buried insulating layer pattern self-aligned under the second top semiconductor layer pattern; and growing a buried semiconductor layer in the recess and the extending recess, the buried semiconductor layer being in contact with the first top semiconductor layer pattern, the second top semiconductor layer pattern, and the semiconductor substrate.

25. The method according to claim 24, wherein the gate pattern further comprises:

a gate insulating layer interposed between the top semiconductor layer and the gate electrode; and a capping layer pattern deposited on the gate electrode.

26. The method according to claim 24, further comprising, before forming the sacrificial spacer, forming a sidewall oxide layer to cover the sidewalls of the gate electrode.

27. The method according to claim 24, further comprising, after forming the recess, forming an additional sacrificial spacer to cover the sidewalls of the recess, the elevated semiconductor layer, and the gate pattern, wherein the additional sacrificial spacer is removed by a wet etching process after the buried insulating layer is formed.

28. The method according to claim 24, further comprising: after forming the buried semiconductor layer, forming a lightly doped impurity layer by implanting impurity ions into the semiconductor substrate using the gate pattern as an ion implantation mask;

forming a gate spacer to cover the sidewalls of the gate pattern; and forming a heavily doped impurity layer in the second top semiconductor layer pattern by implanting impurity ions into the semiconductor substrate using the gate pattern and the gate spacer as ion implantation masks.

29. The method according to claim 28, further comprising, after forming the heavily doped impurity layer, forming a metal silicide layer on the elevated semiconductor layer.

* * * * *